(12) United States Patent
Sim et al.

(10) Patent No.: US 9,960,860 B2
(45) Date of Patent: May 1, 2018

(54) COVER ACCESSORY INCLUDING ELECTROMAGNETIC WAVE SUPPRESSION FUNCTION FOR WIRELESS COMMUNICATION DEVICE

(71) Applicant: Electronics and Telecommunications Research Institute, Daejeon (KR)

(72) Inventors: Dong-Uk Sim, Daejeon (KR); Sang il Kwak, Daejeon (KR); Jong Hwa Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 31 days.

(21) Appl. No.: 15/044,480

(22) Filed: Feb. 16, 2016

(65) Prior Publication Data
US 2016/0241690 A1 Aug. 18, 2016

(30) Foreign Application Priority Data
Feb. 16, 2015 (KR) .................. 10-2015-0023311

(51) Int. Cl.
*H04M 1/00* (2006.01)
*H04B 15/02* (2006.01)
*H05K 9/00* (2006.01)

(52) U.S. Cl.
CPC ........... *H04B 15/02* (2013.01); *H05K 9/0086* (2013.01)

(58) Field of Classification Search
None
See application file for complete search history.

(56) References Cited

U.S. PATENT DOCUMENTS

| 2003/0142486 A1* | 7/2003 | Arakawa | H05K 9/0096 361/818 |
| 2006/0138945 A1* | 6/2006 | Wolk | H01L 27/3211 313/506 |
| 2009/0284404 A1* | 11/2009 | Sim | H01Q 17/00 342/1 |
| 2010/0156695 A1* | 6/2010 | Sim | H01Q 17/008 342/1 |
| 2011/0133978 A1* | 6/2011 | Sim | H01Q 17/00 342/1 |
| 2011/0148738 A1* | 6/2011 | Sim | H01Q 17/00 343/909 |

(Continued)

FOREIGN PATENT DOCUMENTS

| KR | 100636816 B1 | 10/2006 |
| KR | 100791227 B1 | 12/2007 |

(Continued)

*Primary Examiner* — Zhiyu Lu
(74) *Attorney, Agent, or Firm* — William Park & Associates Ltd.

(57) ABSTRACT

Provided is a cover accessory for a wireless communication device, including an electromagnetic suppressing pattern layer on a surface adjoining at least one surface on which an electromagnetic wave is irradiated from the wireless communication device, wherein the electromagnetic suppressing pattern layer includes a first dielectric layer and a frequency selective surface (FSS) pattern with a unit cell having electromagnetic surface resistance periodically repeated thereon, and the FSS pattern is provided by etching the first dielectric layer to inject an FSS pattern material or by printing the FSS pattern material on the first dielectric layer.

17 Claims, 11 Drawing Sheets

(56) References Cited

U.S. PATENT DOCUMENTS

2012/0162001 A1\*  6/2012  Sim .................. H01Q 17/008
                                              342/4
2013/0050006 A1\*  2/2013  Sim .................. H01Q 17/00
                                              342/4
2013/0088408 A1   4/2013  Etri
2013/0277579 A1\* 10/2013  Sim .................. H05K 9/0003
                                              250/515.1

FOREIGN PATENT DOCUMENTS

| KR | 1020090118617 A | 11/2009 |
|----|-----------------|---------|
| KR | 1020130037948 A | 4/2013  |
| KR | 101428461 B1    | 8/2014  |

\* cited by examiner

COVER ACCESSORY INCLUDING ELECTROMAGNETIC WAVE SUPPRESSION FUNCTION FOR WIRELESS COMMUNICATION DEVICE

CROSS-REFERENCE TO RELATED APPLICATIONS

This U.S. non-provisional patent application claims priority under 35 U.S.C. § 119 of Korean Patent Application No. 10-2015-0023311, filed on Feb. 16, 2015, the entire contents of which are hereby incorporated by reference.

BACKGROUND

The present disclosure herein relates to a cover accessory for a wireless communication device, and more particularly to, a cover accessory including an electromagnetic wave suppression function for a wireless communication device.

With the recent rapid development of IT technology and increase in communication needs of humans, wireless communication devices such as mobile terminals become necessities of our contemporaries. However, with the increase in usage of these wireless communication devices, an influence of electromagnetic waves on human bodies becomes an important issue. In addition, according to the appearance of wearable devices, concerns increase about the influence of electromagnetic waves from mobile phones on the entire body in addition to the head.

Currently, the influence of the electromagnetic waves in a frequency band used by mobile phones on the human bodies is being controversial. It is reported that when accumulated in the human bodies, these electromagnetic waves may influence various diseases such as leukemia, brain tumor, headache, and loss of vision, lead to brainwave confusion, an exhaust on male reproductive function, or the like. In particular, on Jun. 1, 2011, the international agency for research on cancer (IARS) under the world health organization (WHO) reported that mobile phones increase the risk of some brain cancers, while classifying the mobile phone call as a 2B-grade cancer-causing material, which is a third highest grade of cancer-causing material and to which an exhaust gas discharged from an automobile engine belongs.

The WHO had announced the opinion that there is no indisputable evidence showing the correlation between the use of mobile phones and occurrence of cancer. However, such a research reversed the opinion. The WHO recommends: children do not use mobile phones if not urgent, mobile phones be not placed near the human bodies, corded telephone be used for a long conversation, and a text message be used if possible.

SUMMARY

The present disclosure provides a cover accessory for a wireless communication device capable of selectively suppressing an electromagnetic wave generated during a mobile phone call.

An embodiment of the inventive concept provides a cover accessory for a wireless communication device. The cover accessory includes: an electromagnetic suppressing pattern layer on a surface adjoining at least one surface on which an electromagnetic wave is irradiated from the wireless communication device, wherein the electromagnetic suppressing pattern layer includes a first dielectric layer and a frequency selective surface (FSS) pattern with a unit cell having electromagnetic surface resistance periodically repeated thereon, and the FSS pattern is provided by etching the first dielectric layer to inject an FSS pattern material or by printing the FSS pattern material on the first dielectric layer.

In an embodiment, a shape of the FSS pattern may include at least one of shapes of quadrangular patch, triangular patch, circular patch, loop, Hilbert curve, or Sierpinski filling curve.

In an embodiment, the unit cell may further include a second dielectric layer on the first dielectric layer and the FSS pattern.

In an embodiment, a material of the first and second dielectric layers may be polyethylene or urethane.

In an embodiment, the electromagnetic wave layer may adjust a cutoff frequency and bandwidth by using at least one of a size of the unit cell, a size of the FSS pattern, a shape of the FSS pattern, an interval between the unit cell and FSS pattern, permittivities of the first and second dielectric layers, or thicknesses of the first and second dielectric layers.

In an embodiment of the inventive concept, a cover accessory for a wireless communication device is provided. The cover accessory includes: a first cover detachably coupled to a rear surface of the wireless communication device; a second cover configured to extend from the first cover and cover a display area provided on a front surface of the wireless communication device; and an electromagnetic suppressing pattern layer on one surface of each of the first and second covers, wherein the electromagnetic suppressing pattern layer includes a first dielectric layer and a frequency selective surface (FSS) pattern with a unit cell having electromagnetic surface resistance periodically repeated thereon, and the FSS pattern is provided by etching the first dielectric layer to inject an FSS pattern material or by printing the FSS pattern material on the first dielectric layer.

In an embodiment, the FSS pattern material may be indium tin dioxide or carbon nano-tube.

In an embodiment, a shape of the FSS pattern may include at least one of shapes of quadrangular patch, triangular patch, circular patch, loop, Hilbert curve, or Sierpinski filling curve.

In an embodiment, the electromagnetic suppressing pattern layer on the first cover and the electromagnetic suppressing pattern layer on the FSS pattern may have an identical shape.

In an embodiment, the electromagnetic suppressing pattern layer on the first cover and the electromagnetic suppressing pattern layer on the FSS pattern may have different shapes.

In an embodiment, the unit cell may further include a second dielectric layer on the first dielectric layer and the FSS pattern.

In an embodiment, a material of the first and second dielectric layers may be a polyethylene or urethane.

In an embodiment, the electromagnetic wave layer may adjust a cutoff frequency and bandwidth by using at least one of a size of the unit cell, a size of the FSS pattern, a shape of the FSS pattern, an interval between the unit cell and FSS pattern, permittivities of the first and second dielectric layers, or thicknesses of the first and second dielectric layers.

In an embodiment, the electromagnetic suppressing pattern layer on the first cover and the electromagnetic suppressing pattern layer on the FSS pattern may have different cutoff frequencies and bandwidths.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the present invention will be described in detail with reference to the accompanying drawings so that the present invention can be easily realized by those skilled in the art. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, exemplary embodiments of the inventive concept will be described in detail with reference to the accompanying drawings.

A frequency selective surface (FSS) is a surface artificially manufactured to selectively transmit or cut off a desired frequency for an electromagnetic wave incident vertically or at an arbitrary angle. The FSS may be obtained by spatially disposing a conductor or opening surface in a certain period. At this point, an area spatially corresponding to a single period is called unit cell.

In addition, a shape of a conductor or opening surface inside the unit cell is called unit cell pattern or FSS pattern. There are various patterns from a simple shape such as a quadrangular, triangular, or circular patch to a shape using a Hilbert curve and a Sierpinski space filling curve. The FSS has a frequency response characteristic determined according to an array type and period of unit cells, and material characteristics of dielectrics and patterns used on and under the unit cells in addition to a geometrical shape of the unit cell pattern.

This FSS has a typical structure where a metal conductive pattern is etched on a dielectric. A desired specific frequency band may be selectively cut off to be reflected by adjusting each of design parameters related to the pattern. Alternatively, only a specific frequency band may be passed and a remaining band may be reflected. When it is desired to cut off, but not to totally reflect, an electromagnetic wave, absorption and reflection may simultaneously occur by manufacturing the FSS pattern with a material having surface resistance, not with a pure metal conductor. Examples of the FSS pattern material may include ITO (indium tin oxide) and CNT (carbon nanotube). Such a FSS pattern material satisfies both excellent electroconductivity (surface resistance: 1000 Ohm/sq or less) and high transmission (transmissivity in a visible light range of 380-780 nm: 80% or more).

Figure 1:
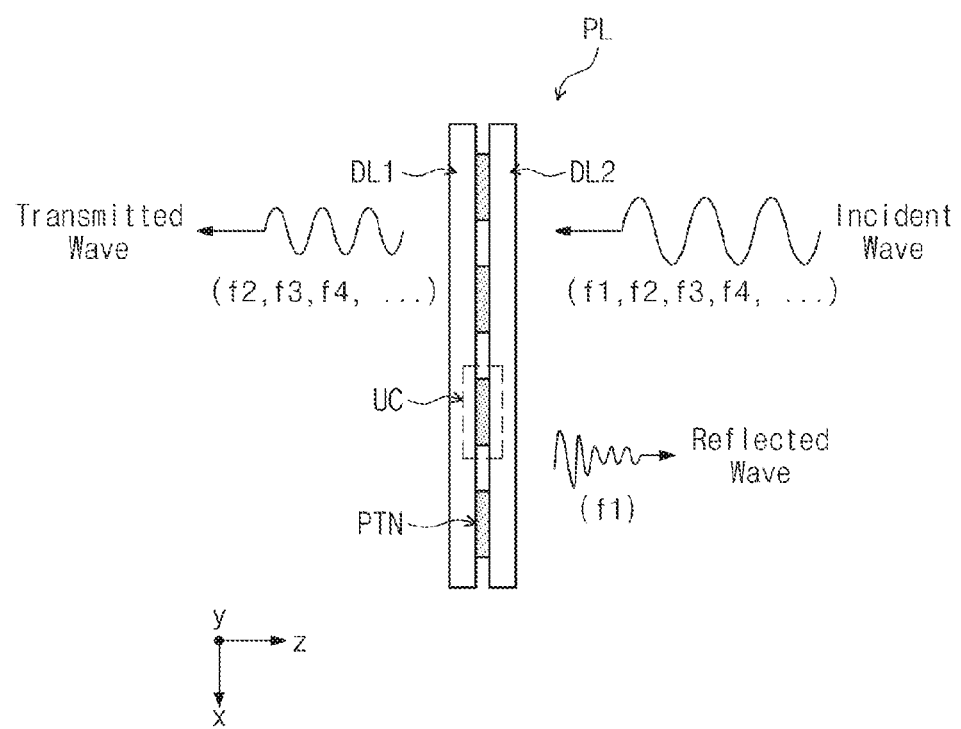
FIG. 1 exemplarily illustrates reflection and transmission characteristics of an electromagnetic wave with respect to a pattern layer on which a frequency selective surface (FSS) structure according to an embodiment of the inventive concept is provided.

FIG. 1 exemplarily illustrates reflection and transmission characteristics of an electromagnetic wave with respect to a pattern layer PL on which an FSS structure according to an embodiment of the inventive concept is provided. Referring to FIG. 1, the pattern layer PL may include a first dielectric layer DL1, a second dielectric layer DL2, and a unit cell UC. The pattern layer PL may be an electromagnetic suppressing pattern layer.

The first and second dielectric layers DL1 and DL2 may be provided with various materials having permittivities. For example, the first and second dielectric layers DL1 and DL2 may be a transparent film such as a PET (polyethylene terephthalate) film, a urethane film or the like. In addition, the materials, thicknesses and the like of the first and second dielectric layers DL1 and DL2 may be adjusted according to a frequency characteristic of the pattern layer PL. For example, the second dielectric layer DL2 may be air. The first and second dielectric layers DL1 and DL2 may be formed with materials having difference permittivities. The second dielectric layer DL2 may be provided on a periodic pattern PTN in order to protect the periodic pattern provided on the first dielectric layer DL1.

The unit cell UC may include the first dielectric layer DL1 and the periodic pattern PTN provided on the first dielectric layer DL1 with a material having surface resistance. The unit cell UC is periodically repeated to provide the pattern layer PL. In other words, the UC is a minimum repetition unit for providing the pattern layer PL.

The unit cell UC may have a structure where loss is added to the FSS and perform filtering on a desired frequency band. Through this filtering, the unit cell UC may reflect a specific incident wave and adjust a phase in the dielectric.

The unit cell UC may have a shape that suppresses the electromagnetic wave, an electrical length of the periodic pattern PTN may determine inductance L, and a line interval of the periodic pattern PTN and an interval between the unit cells may determine capacitance C. Accordingly, the pattern layer PL may entirely configure an L-C circuit and determine a passing or cutoff frequency and a bandwidth by adjusting magnitudes of L and C.

Referring to FIG. 1 again, a description will be provided about reflection and transmission characteristics of the incident electromagnetic wave, when the electromagnetic wave is incident to the FSS pattern layer PL.

The incident wave may be configured of a plurality of frequencies f1, f2, f3, and f4 . . . . For the incident wave incident to the FSS pattern layer, the periodic structure of the FSS may reflect the incident wave of a specific frequency and pass the incident wave of the remaining frequencies. In FIG. 1, it may be seen that the incident wave having a frequency of f1 is reflected, and the incident waves having the remaining frequencies f2, f3, and f4 . . . are passed. For example, a frequency band of f1 may be 1.9 GHz band in WCDMA. In other words, the FSS pattern layer PL may cut off the 1.9 GHz frequency band.

At this point, the cutoff f1 frequency band may be totally reflected, and when the FSS pattern layer PL is manufactured to have desired surface resistance, some of the incident wave of f1 frequency band may be absorbed and another some thereof may be reflected. This effect may be useful when influence of a reflective wave is intended to be suppressed in a reflection direction.

Figure 2:
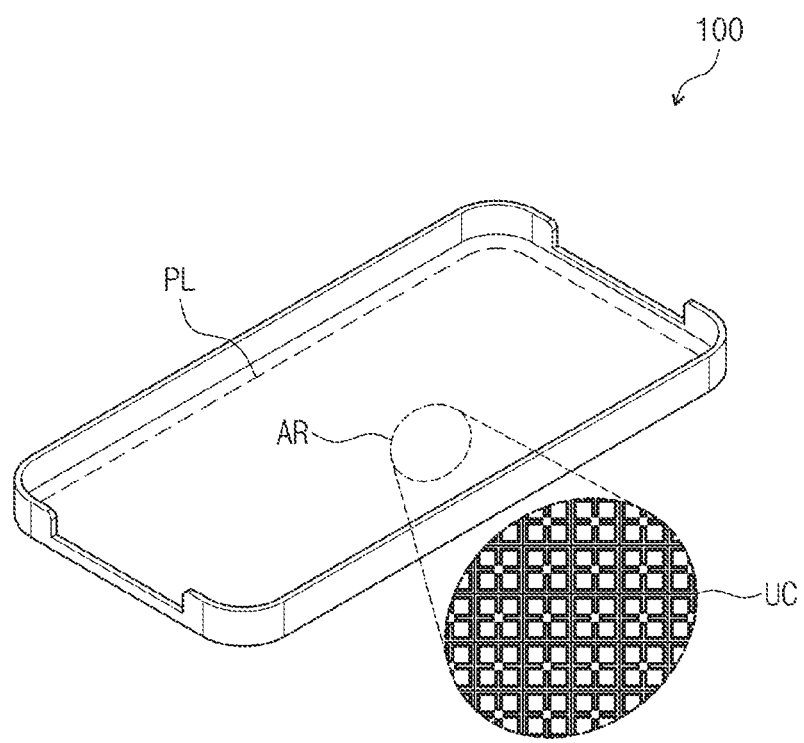
FIG. 2 exemplarily illustrates a cover accessory for a wireless communication device according to an embodiment of the inventive concept.

FIG. 2 exemplarily illustrates a cover accessory for a wireless communication device according to an embodiment of the inventive concept. A cover accessory 100 for a wireless communication device according to an embodiment of the inventive concept may have an FSS periodic structure on the bottom surface and suppress an electromagnetic wave irradiated on a rear side of the wireless communication device.

Referring to FIG. 2, the FSS pattern layer PL is provided on the bottom surface of the cover accessory 100 for the wireless communication device according to the inventive concept. When a part AR of the bottom surface is enlarged, it may be seen that the FSS pattern layer PL has a plurality of repetitive unit cells. This unit cell UC has electromagnetic surface resistance to cut off or pass an electromagnetic wave having a specific frequency irradiated from the wireless communication device. Here, the electromagnetic surface resistance means that the surface of the unit cell UC has electrical surface resistance Rs (ohm/sq) or magnetic surface resistance.

When the FSS pattern layer PL is provided with a material having the electromagnetic surface resistance, various electromagnetic characteristics, such as total reflection, total transmission, partial reflection, partial transmission, or the like, may be realized in a specific frequency band.

The FSS pattern layer PL according to the inventive concept may be provided by etching the bottom surface of the cover accessory 100 in a set periodic structure and then injecting a material having the electromagnetic surface resistance. Alternatively, the FSS pattern layer PL according to the inventive concept may be provided by printing a material having the electromagnetic surface resistance on the bottom surface of the cover accessory 100. In this case, the material configuring the cover accessory 100 may play a role of a dielectric layer.

The FSS pattern layer PL according to the inventive concept may be provided by disposing a dielectric layer on the bottom surface of the cover accessory 100 and then injecting a material having the electromagnetic surface resistance to the etched part. In addition, the FSS pattern layer PL according to the inventive concept may be provided by disposing a first dielectric layer on the bottom surface of the cover accessory 100, etching the first dielectric layer, injecting a material having the electromagnetic surface resistance to the etched part, and then disposing a second dielectric layer thereon. The above-described dielectric layer may be provided with a plastic or fabric material and disposed on the bottom surface of the cover accessory 100 in a thin film shape.

The cover accessory 100 according to an embodiment of the inventive concept may suppress an electromagnetic wave irradiated on the rear surface of the wireless communication device by using the FSS patter layer PL disposed on the bottom surface of the cover accessory 100. In addition, the frequency response characteristic of the FSS pattern layer PL may be diversely selected according to a geometrical shape and material characteristic of an FSS pattern PTN, an array type and period of the unit cells UC, and a material of the employed dielectric.

Figure 3:
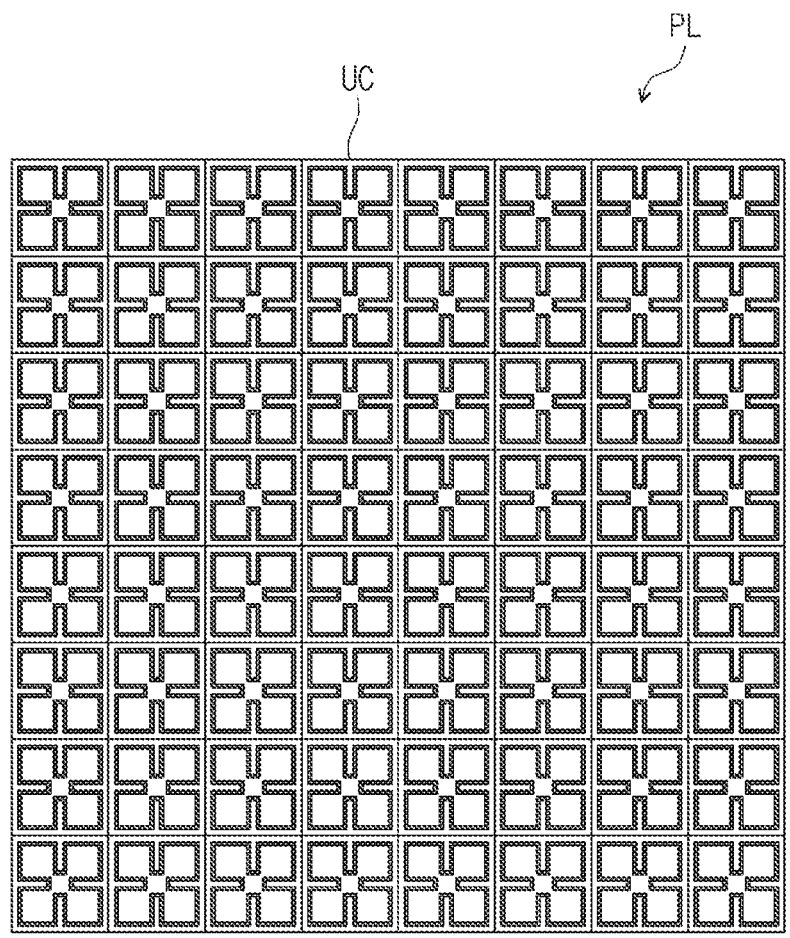
FIG. 3 exemplarily illustrates an FSS pattern layer provided on a bottom surface of the cover accessory for the wireless communication device of FIG. 2.

FIG. 3 exemplarily illustrates an FSS pattern layer PL provided on a bottom surface of the cover accessory 100 for the wireless communication device of FIG. 2. Referring to FIG. 3, the FSS pattern layer PL may be provided with the unit cells repeated in a periodic structure. The FSS pattern layer PL may be provided by etching the dielectric in a shape of the FSS pattern PTN and then injecting an FSS pattern PTN of a specific material to the etched area. Alternatively, the FSS pattern layer PL may be provided by directly printing the FSS pattern PTN on the dielectric. The FSS pattern layer PL provided as described above, has a surface having the electromagnetic surface resistance and may totally reflect, totally transmit, partially reflect, or partially transmit an electromagnetic wave of a specific frequency band.

FIGS. 4A to 4E exemplarily illustrate a structure realizable with a unit cell pattern according to an embodiment of the inventive concept.

Figure 4A:
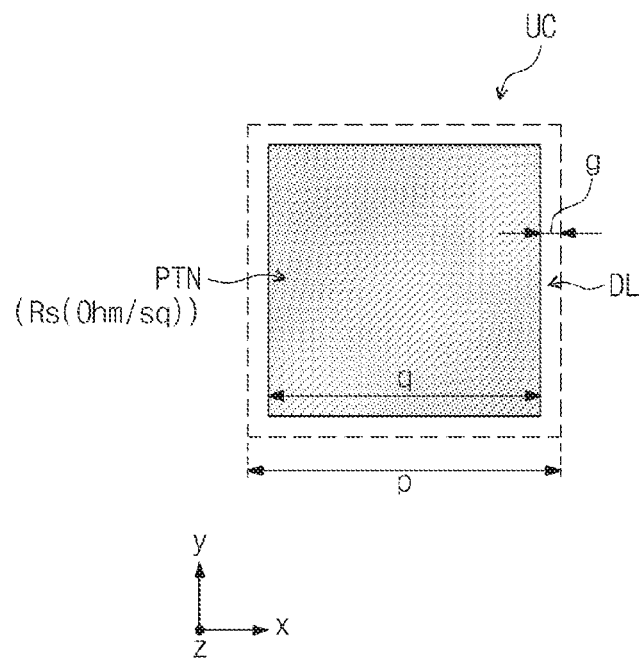
FIGS. 4A to 4E exemplarily illustrate a structure realizable with a unit cell pattern according to an embodiment of the inventive concept.

FIG. 4A illustrates a unit cell providing the FSS pattern PTN in a quadrangle structure on the dielectric layer DL. This FSS pattern PTN may be provided in various patterns such as a triangle or circle.

Figure 4B:
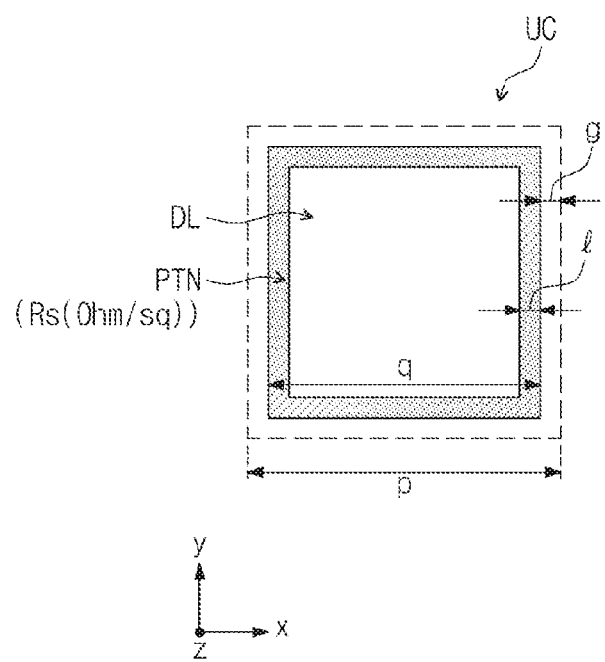

FIG. 4B illustrates a unit cell providing the FSS pattern PTN in a rim shape on the dielectric layer DL. This rim shape FSS pattern PTN may be provided in various shapes such as a loop, Hilbert curve, or Sierpinski space filing curve shape.

In other words, an electrical length according to the shape of the FSS pattern PTN may determine the inductance L, and a line interval of the FSS pattern PTN and an interval between unit cells UC may determine the capacitance C. Accordingly, the unit cells UC may be interpreted as a L-C resonant circuit, and the L-C resonant circuit may determine a cutoff or passing frequency.

Since the structure of the FSS pattern layer PL according to an embodiment of the inventive concept has the surface resistance Rs, the FSS pattern layer PL may be interpreted as an R-L-C resonant circuit in which resistance R is inserted in the L-C circuit. Accordingly, in order to cut off a desired frequency band, it is required that the structure of the FSS pattern PTN induces proper L and C.

In view of this aspect, the FSS pattern PTN of FIGS. 4A and 4B has a structure in which a resonance band is difficult to generate due to very small capacitance C. Accordingly, this FSS pattern PTN may operate only as a low pass filter or high pass filter not to selectively cut off or pass a specific frequency band.

Figure 4C:
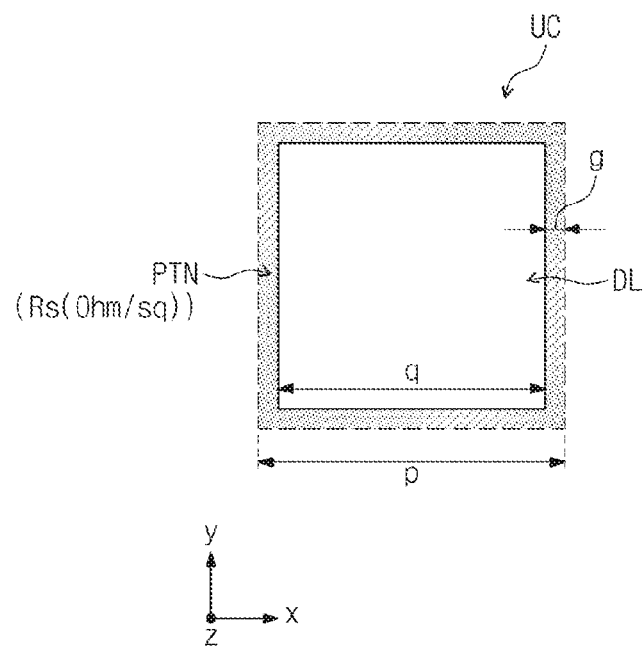
Figure 4D:
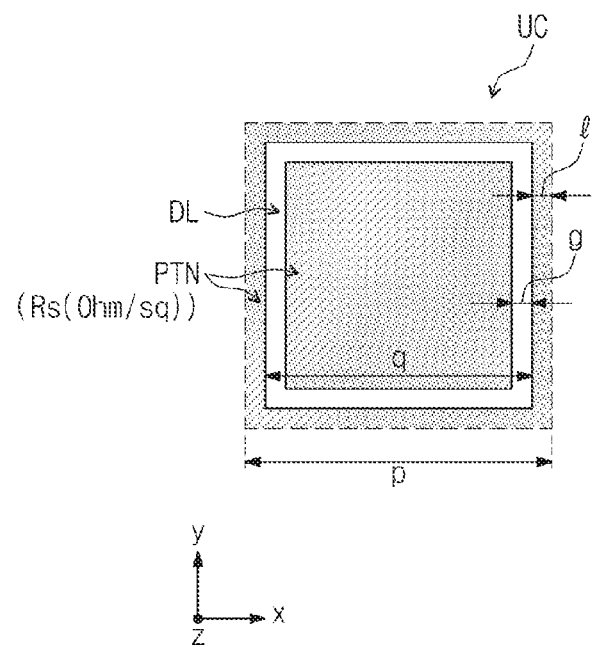
Figure 4E:
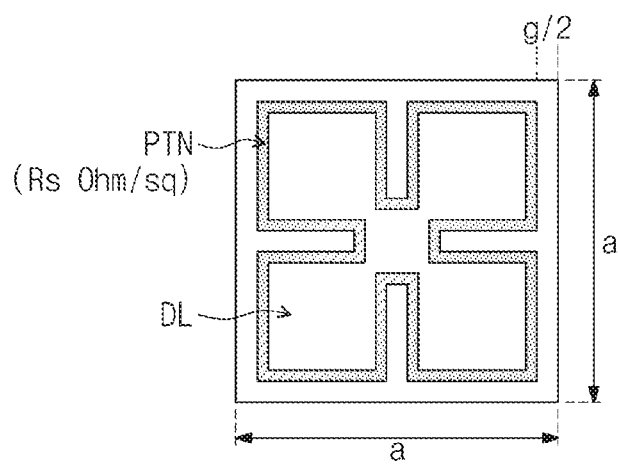

On the other hand, FIGS. 4C to 4E illustrate a structure having a greater capacitance C. FIGS. 4C and 4D both illustrate the FSS pattern PTN of a quadrangular patch shape having an opening part. FIG. 4C illustrates a structure having an interval g between the FSS pattern PTN and the unit cell UC, and FIG. 4D illustrates a structure without an interval between the FSS pattern PTN and the unit cell UC. In addition, FIG. 4E illustrates an FSS pattern having a meandering shape. For the structures shown in FIGS. 4C and 4D, the FSS patterns PTN have a quadrangular patch shape with an opening part, and accordingly may have a greater value of capacitance C than the structures shown in FIGS. 4A and 4B. In addition, the structure of FIG. 4E may have a greater value of capacitance C than those of FIGS. 4C and 4D. The structures of FIGS. 4C to 4E may provide a greater value of capacitance C enough to form a resonance band. Accordingly, in the case where the FSS pattern PTN is formed in the structure shown in FIGS. 4C to 4E, the FSS pattern PTN may have a function of cutting off or passing an electromagnetic wave in the resonance band.

In the end, the size p or a of the unit cell UC, electrical length and interval q of the FSS pattern PTN, interval g with the unit cell UC, material characteristic Rs (Ohm/sq) of the pattern, permittivity of a dielectric configuring the dielectric layer DL, and the like may be design parameters for determining the cutoff frequency and bandwidth. Accordingly, the cutoff frequency and bandwidth may be adjusted by changing at least one of these design parameters.

Figure 5A:
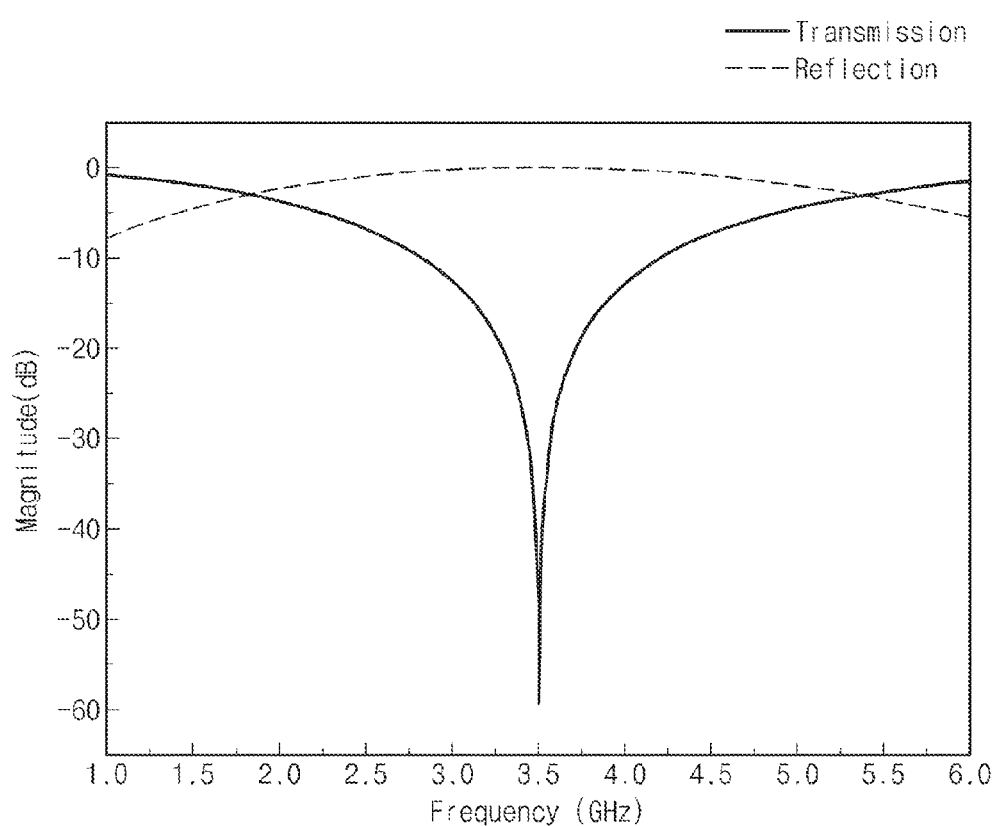
FIG. 5A is a graph showing reflection and transmission characteristics of an FSS pattern layer when the FSS pattern is provided with a metal according to an embodiment of the inventive concept.

FIG. 5A is a graph showing reflection and transmission characteristics of the FSS pattern layer when the FSS pattern is provided with a metal according to an embodiment of the inventive concept. In other words, the FSS pattern layer PL is disposed on the dielectric, wherein the FSS pattern PTN provided with a metal material is etched. By adjusting the design parameters, a desired specific frequency band may be selectively cut off and reflected, or on the contrary, selectively passed and the remaining band may be reflected.

FIG. 5A shows a characteristic that an incident wave having a frequency around 3.5 GHz does not pass through and is almost reflected by the FSS period structure according to an embodiment of the inventive concept. In addition, it may be seen that in a frequency band other than 3.5 GHz frequency is passed and reflection thereof is reduced.

Figure 5B:
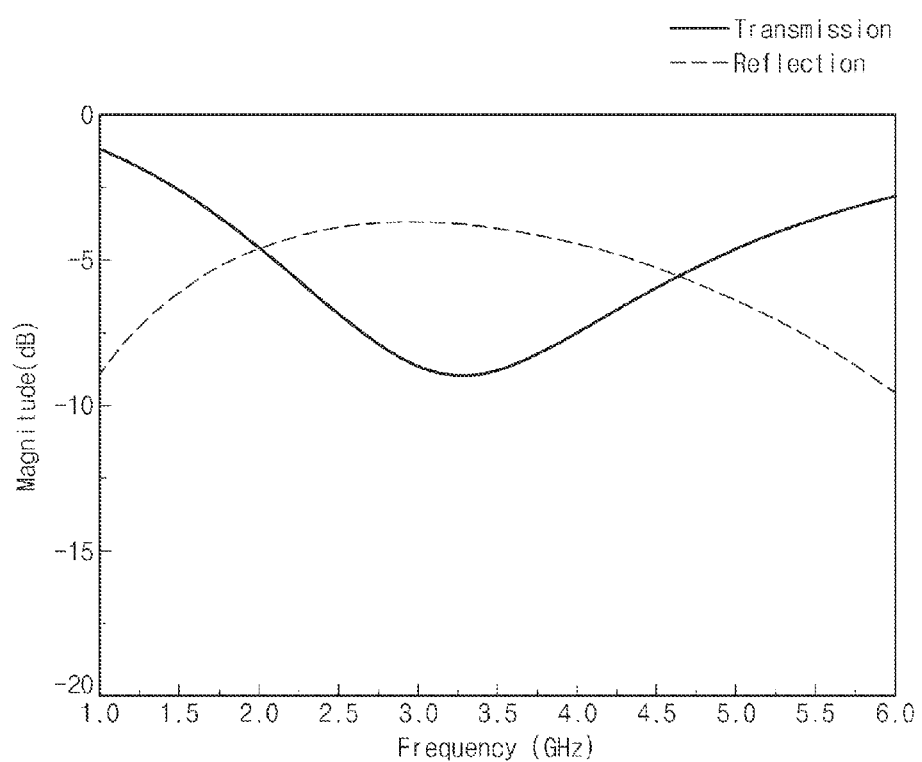
FIG. 5B is a graph showing reflection and transmission characteristics of an FSS pattern layer when the FSS pattern is provided with a material having electromagnetic surface resistance according to an embodiment of the inventive concept.

FIG. 5B is a graph showing reflection and transmission characteristics of the FSS pattern layer when the FSS pattern is provided with a material having an electromagnetic surface resistance according to an embodiment of the inventive concept.

Referring to FIG. 5B, it may be seen that the FSS pattern PTN provided with a metal material allows reflection and transmission of the incident wave to more properly coexist than the case of FIG. 5A. Since loss becomes greater as the magnitude of the electromagnetic surface resistance becomes greater, transmission of an electromagnetic wave becomes reduced.

Figure 6:
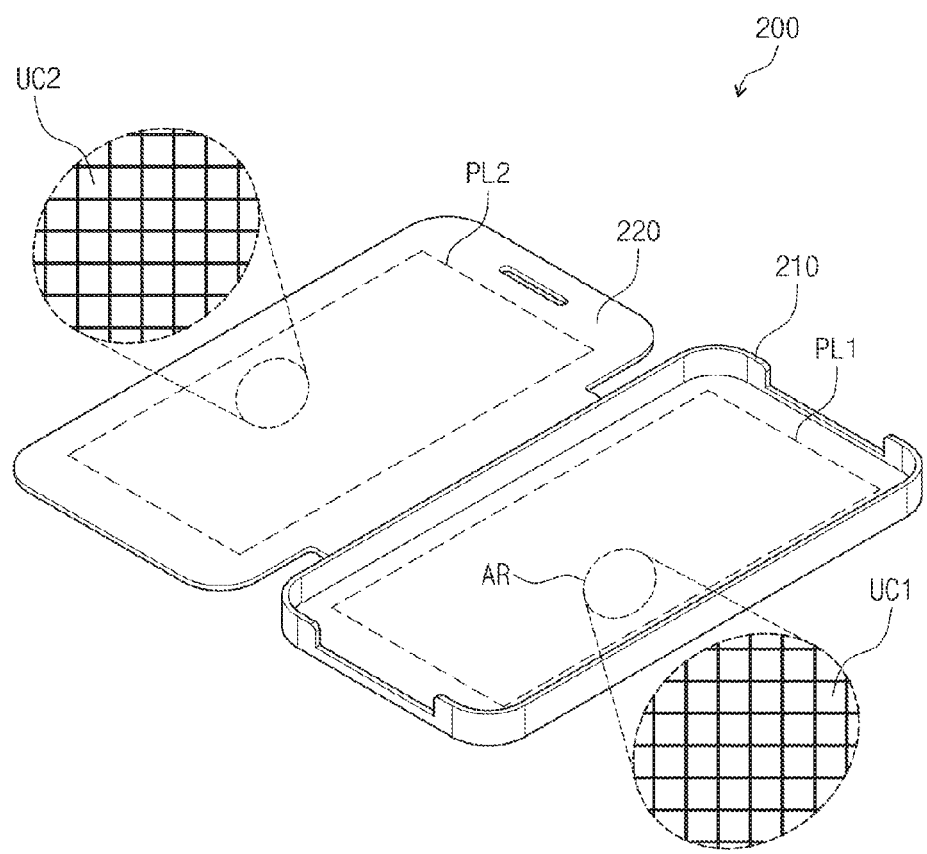
FIG. 6 exemplarily illustrates a cover accessory for a wireless communication device according to another embodiment of the inventive concept.

FIG. 6 exemplarily illustrates a cover accessory for a wireless communication device according to another embodiment of the inventive concept. Referring FIG. 6, a cover accessory 200 for a wireless communication device according to the other embodiment of the inventive concept includes a first protecting cover 220 and a second protecting cover 210.

Hereinafter, it is assumed that the cover accessory 200 for the wireless communication device according to the other embodiment is a cover accessory for a mobile phone.

The first protecting cover 220 may be detachably coupled on a surface from or to which a battery is detached or attached. In this case, the first protecting cover 220 may be a battery cover for directly covering the battery. Alternatively, the first protecting cover 220 may be a cover accessory for covering the rear surface of the mobile phone to which the battery cover is coupled.

The second protecting cover 210 may be configured to extend from one surface of the first protecting cover 220 to cover the front surface of the mobile phone, namely, a surface on which a display area is located. In other words, the second protecting cover 210 may be provided with a flip cover.

On the bottom surface of the first protecting cover 220, a first pattern layer PL1 of the above-described FSS periodic structure may be provided, and on the bottom surface of the second protecting cover 210, a second pattern layer PL2 of the FSS periodic structure may be provided. When a part AR of the bottom surface extends, a first unit cell UC1 is repeatedly provided on the first pattern layer PL1, and a second unit cell UC2 is repeatedly provided on the second pattern layer PL2. Each of the unit cells UC1 and UC2 has electromagnetic surface resistance, and may cut off or pass an electromagnetic wave having a specific frequency irradiated from the wireless communication device. Here, the electromagnetic surface resistance may mean that the surface of the unit cell UC has electrical surface resistance Rs (ohm/sq) or magnetic surface resistance.

The first and second unit cells UC1 and UC2 may be any one of unit cells of FIGS. 4A to 4E. However, shapes of the first and second unit cells UC1 and UC2 are not limited hereto, and may have various shapes.

The shapes of the first and second unit cells UC1 and UC2 may be identical to or different from each other. When the first and second unit cells have an identical shape, the cutoff or passing frequency and bandwidth of the first and second pattern layers PL1 and PL2 may be the same. When the first and second unit cells have different shapes, the cutoff or passing frequency and bandwidth of the first and second pattern layers PL1 and PL2 may be different. In this case, since frequency responses of dual bands may be obtained with one cover accessory 200, an electromagnetic wave may be suppressed at the time of roaming to other countries whose transmission frequency band is different from a domestic transmission frequency. In other words, it is not necessary to replace the cover accessory 200 in order to suppress the electromagnetic wave at the time of roaming.

Figure 7:
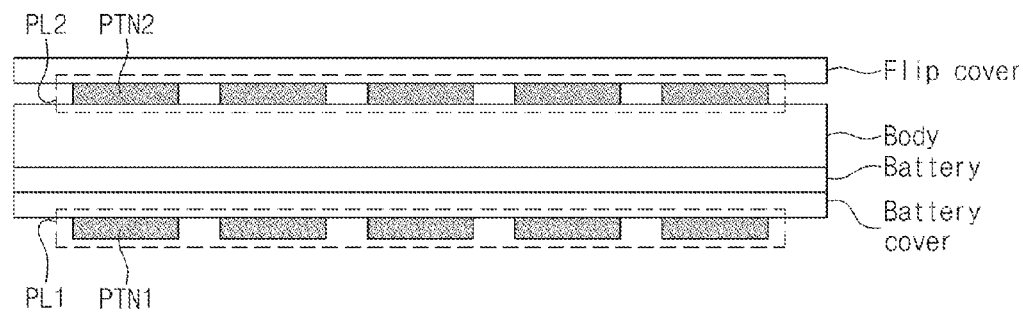
FIG. 7 illustrates an embodiment in which the cover accessory of FIG. 6 is mounted on the mobile phone and used.

FIG. 7 illustrates an embodiment in which the cover accessory of FIG. 6 is mounted on the mobile phone and used. In detail, FIG. 7 illustrates a case where a flip cover covers the front surface, namely, the display area of a mobile phone body. Referring to FIG. 7, the first pattern layer PL1 is provided on one surface of the battery cover, and the second pattern layer PL2 is provided on one surface of the flip cover.

As described above, when the flip cover with the first pattern layer PL1 provided thereon covers the front surface of the mobile phone, the electromagnetic wave traveling in a direction of the user's head may be effectively cut off at the time of calling. Simultaneously, since the battery cover with the second pattern layer PL2 provided thereon covers the rear surface of the mobile phone, the electromagnetic wave traveling in a direction of the user's hand may also be effectively cut off.

When the cover accessory 200 according to an embodiment of the inventive concept is used as illustrated in FIG. 7, the electromagnetic wave traveling in the direction of the user's head may also be simultaneously suppressed with the electromagnetic wave traveling in the direction of the user's hand.

Figure 8:
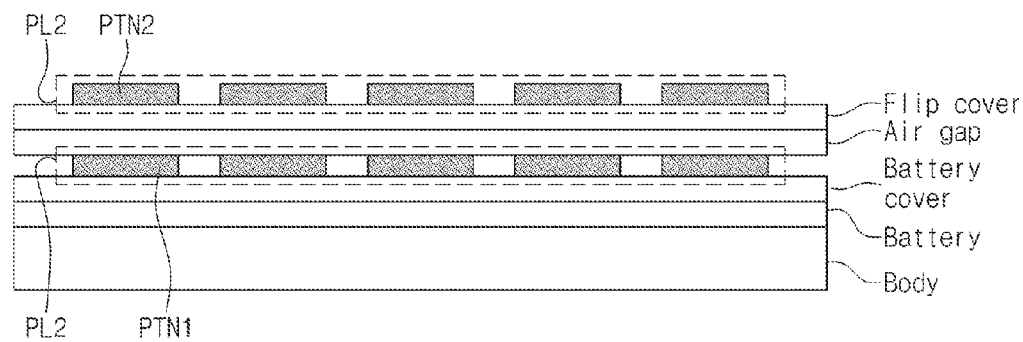
FIG. 8 illustrates another embodiment in which the cover accessory of FIG. 6 is mounted on the mobile phone and used.

FIG. 8 illustrates another embodiment in which the cover accessory of FIG. 6 is mounted on the mobile phone and used. In detail, FIG. 8 illustrates a case where the flip cover covers the rear surface, namely, the battery cover of a mobile phone body. This may be the case where calling is performed with the flip cover of the mobile phone body folded rearwards. In this case, namely, the pattern layer may be provided in a doubly stacked type on the rear surface of the mobile phone body. At this point, an air layer is provided between the first and second pattern layers PL1 and PL2 to play a role of dielectric.

When the cover accessory 200 according to an embodiment of the inventive concept is used as illustrated in FIG. 8, the electromagnetic wave traveling in the direction of the user's hand may be further suppressed compared with the case illustrated in FIG. 7.

Figure 9:
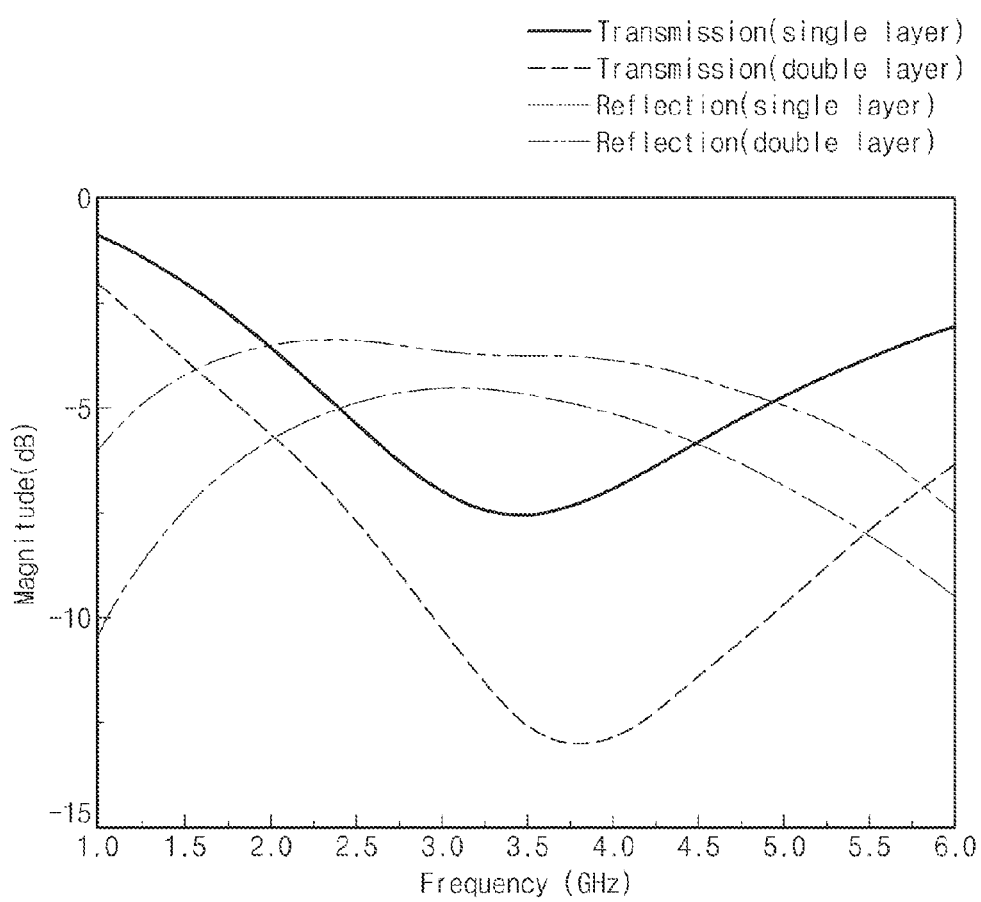
FIG. 9 is a graph showing reflection and transmission characteristics of an electromagnetic wave in cases where the FSS pattern layer is a single layer and is doubly stacked.

FIG. 9 is a graph showing reflection and transmission characteristics of an electromagnetic wave in cases where the FSS pattern layer is a single layer and doubly stacked. Here, the doubly stacked case is a case where the pattern layers provided on the battery cover and flip cover may have an identical structural pattern.

Referring to FIG. 9, the FSS pattern layer having the single layer structure has better cutoff or reflection characteristic of an electromagnetic wave, compared with that having the doubly stacked structure. As described above, in the case of adjusting the shape of the FSS pattern and design parameters of the pattern layer, dual band frequency response may be realized which is capable of suppressing or reflecting electromagnetic waves in different frequency bands.

According to embodiments of the inventive concept, an electromagnetic wave irradiated on the human body may be suppressed according to user's selection at the time of using a wireless communication device.

According to embodiments of the inventive concept, since the wireless communication device is not influenced in a frequency band other than a communication frequency thereof, degradation in performance of a wireless communication device may be prevented.

According to embodiments of the inventive concept, since capable of being suppressed in different frequency bands, the electromagnetic wave may be efficiently suppressed at the time of phone roaming to a foreign country having a different communication frequency band.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A cover accessory for a wireless communication device, the cover accessory comprising:
   an electromagnetic suppressing pattern layer on a surface adjoining at least one surface on which an electromagnetic wave is irradiated from the wireless communication device,
   wherein the electromagnetic suppressing pattern layer comprises a first dielectric layer and a frequency selective surface (FSS) pattern with a unit cell having electromagnetic surface resistance periodically repeated thereon, and the FSS pattern is provided by etching the first dielectric layer to inject an FSS pattern material or by printing the FSS pattern material on the first dielectric layer, and
   wherein the FSS pattern is configured with the FSS pattern material having the electromagnetic surface resistance such that reflection of an incident electromagnetic wave and transmission of the incident electromagnetic wave out of the cover accessory coexist over a band of frequencies.

2. The cover accessory of claim 1, wherein the FSS pattern material is metal.

3. The cover accessory of claim 2, wherein the metal includes indium tin oxide and carbon nano tube.

4. The cover accessory of claim 1, wherein a shape of the FSS pattern is a shape forming the electromagnetic surface resistance by repeating the shape.

5. The cover accessory of claim 4, wherein the shape of the FSS pattern comprises at least one of shapes of quadrangular patch, triangular patch, circular patch, loop, Hilbert curve, of Sierpinski filling curve.

6. The cover accessory of claim 1, wherein the unit cell further comprises a second dielectric layer on the first dielectric layer and the FSS pattern.

7. The cover accessory of claim 6, wherein a material of the first and second dielectric layers is polyethylene terephthalate or urethane.

8. The cover accessory of claim 4, wherein the electromagnetic wave layer adjusts a cutoff frequency and bandwidth by using at least one of a size of the unit cell, a size of the FSS pattern, a shape of the FSS pattern, an interval between the unit cell and FSS pattern, permittivities of the first and second dielectric layers, or thicknesses of the first and second dielectric layers.

9. A cover accessory for a wireless communication device, the cover accessory comprising:
   a first cover detachably coupled to a rear surface of the wireless communication device; a second cover configured to extend from the first cover and cover a display area provided on a front surface of the wireless communication device; and
   an electromagnetic suppressing pattern layer on one surface of each of the first and second covers,
   wherein the electromagnetic suppressing pattern layer comprises a first dielectric layer and a frequency selective surface (FSS) pattern with a unit cell having electromagnetic surface resistance periodically repeated thereon, and the FSS pattern is provided by etching the first dielectric layer to inject an FSS pattern material or by printing the FSS pattern material on the first dielectric layer, and
   wherein the FSS pattern is configured with the FSS pattern material having the electromagnetic surface resistance such that reflection of an incident electromagnetic wave and transmission of the incident electromagnetic wave out of the cover accessory coexist over a band of frequencies.

10. The cover accessory of claim 9, wherein the FSS pattern material is indium tin oxide or carbon nano-tube.

11. The cover accessory of claim 9, wherein a shape of the FSS pattern comprises at least one of shapes of quadrangular patch, triangular patch, circular patch, loop, Hilbert curve, or Sierpinski filling curve.

12. The cover accessory of claim 9, where the electromagnetic suppressing pattern layer on the first cover and the electromagnetic suppressing pattern layer on the second cover have an identical shape.

13. The cover accessory of claim 9, where the electromagnetic suppressing pattern layer on the first cover and the electromagnetic suppressing pattern layer on the second cover have different shapes.

14. The cover accessory of claim 9, wherein the unit cell further comprise a second dielectric layer on the first dielectric layer and the FSS pattern.

15. The cover accessory of claim 14, wherein a material of the first and second dielectric layers is a polyethylene or urethane.

16. The cover accessory of claim 14, wherein the electromagnetic wave layer adjusts a cutoff frequency and bandwidth by using at least one of a size of the unit cell, a size of the FSS pattern, a shape of the FSS pattern, an interval between the unit cell and FSS pattern, permittivities of the first and second dielectric layers, or thicknesses of the first and second dielectric layers.

17. The cover accessory of claim 14, wherein the electromagnetic suppressing pattern layer on the first cover and the electromagnetic suppressing pattern layer on the second cover have different cutoff frequencies and bandwidths.

* * * * *